US007719036B2

(12) United States Patent  
Wadsworth

(10) Patent No.: US 7,719,036 B2  
(45) Date of Patent: May 18, 2010

(54) CHARGE COUPLED DEVICE WITH HIGH QUANTUM EFFICIENCY

(75) Inventor: Mark Wadsworth, Glendora, CA (US)

(73) Assignee: ImagerLabs, Inc., Monrovia, CA (US)

( * ) Notice: Subject to any disclaimer, the term of this patent is extended or adjusted under 35 U.S.C. 154(b) by 791 days.

(21) Appl. No.: 11/502,238

(22) Filed: Aug. 10, 2006

(65) Prior Publication Data

US 2007/0051985 A1 Mar. 8, 2007

Related U.S. Application Data

(60) Provisional application No. 60/714,129, filed on Sep. 2, 2005.

(51) Int. Cl.
*H01L 27/148* (2006.01)
(52) U.S. Cl. .................. 257/221; 438/60; 257/E27.151
(58) Field of Classification Search ................. 257/246, 257/247, 250, E27.153, E27.154, 221; 438/60, 438/75
See application file for complete search history.

(56) References Cited

U.S. PATENT DOCUMENTS

| 4,992,842 | A | | 2/1991 | Yang et al. | |
|---|---|---|---|---|---|
| 6,069,374 | A | * | 5/2000 | Izumi et al. | ................. 257/250 |
| 6,841,811 | B2 | | 1/2005 | Wen et al. | |
| 2001/0031517 | A1 | * | 10/2001 | Hynecek | ..................... 438/144 |
| 2004/0033656 | A1 | * | 2/2004 | Wen et al. | ................... 438/222 |
| 2004/0188597 | A1 | | 9/2004 | Inoue et al. | |
| 2005/0029553 | A1 | | 2/2005 | Hynecek | |
| 2005/0062868 | A1 | * | 3/2005 | Shiiba et al. | ................ 348/316 |
| 2006/0017831 | A1 | * | 1/2006 | Tanaka | ....................... 348/311 |

FOREIGN PATENT DOCUMENTS

JP 60-234363 11/1985

* cited by examiner

*Primary Examiner*—Wael Fahmy  
*Assistant Examiner*—Abul Kalam  
(74) *Attorney, Agent, or Firm*—Haynes and Boone, LLP.

(57) ABSTRACT

A six-phase charge coupled device (CCD) pixel includes a pixel pair, with each pixel having two adjacent control gates overlying corresponding variable potential wells, where voltages applied to the control gates enable charge to be accumulated into and transferred out of the wells. A clear window region overlies a fixed potential gradient region, decreasing in potential away from the control gates. This region enables a wide band of photons to be sensed by the photosensitive silicon of the CCD. The decreasing potential levels facilitate high charge transfer efficiency (i.e., high CTE) from pixel to pixel via the control or transfer gates. By applying particular voltages to the control gates, charge can be quickly and efficiently transferred between pixels. In addition, the window provides a self aligned mask for the implantation steps and thus prevents the formation of pockets (or wells) due to misalignments that decrease the charge transfer efficiency and causes non-uniformity problems as associated with prior art. Furthermore the window provides a flat region that can be covered with an anti-reflective (AR) coating layer, thus further increasing the quantum efficiency.

17 Claims, 5 Drawing Sheets

CHARGE COUPLED DEVICE WITH HIGH QUANTUM EFFICIENCY

RELATED APPLICATION

The present application is based on and claims priority to U.S. Provisional application Ser. No. 60/714,129, filed Sep. 2, 2005.

BACKGROUND

1. Field of the Invention

The present invention relates to methods of manufacturing semiconductor devices, and more particularly to forming high quantum efficiency (QE) charge coupled devices (CCDs).

2. Related Art

Charged coupled device (CCD) sensors have been utilized in various demanding sensing applications such as high end visible light imaging, UV imaging, X-Ray imaging, spectroscopy, and more. However conventional CCDs suffer from poor sensitivity to short wavelength bands such as blue, UV, and soft X-Ray. This problem is caused by the absorption of short wavelength photons by the polysilicon layers utilized in forming gate structures in a CCD. The poor sensitivity to certain wavelength bands is manifested as a reduction in the total Quantum Efficiency (QE) of the CCD.

To overcome the decreased sensitivity problem, several methods were developed and have been used for producing higher QE CCD sensors. The prior art addressing the reduced QE issue includes the following.

Back Thinned CCD (also referred to as Back Illuminated CCD) technology thins the back side of the CCD via a chemical etching or grinding process in order to be able to illuminate the sensor through the back and not through the front side that contain the blocking gate structures. This approach provides high QE and fill factor (FF). However, Back Thinned CCD is a costly process. The process of thinning is both expensive and poor yielding which further increases the device price.

CCD with transparent gate structure technology provides a method of forming the gate structures in the CCD from transparent material such as indium-tin-oxide (ITO). The transparent gate structure allows photons to enter the photosensitive silicon of the CCD unimpeded. A disadvantage to this approach is that it suffers from non-uniformity caused by the variation of the ITO layer thickness across the sensor array that is due to chemical mechanical polishing (CMP) used for achieving the required electrical isolation between adjacent ITO gates. Charge Transfer Efficiency (CTE) is also reduced due to fixed electrostatic charges which happen in overlying insulating layers of the device and cause small potential variations below the insulating gap between the CCD electrodes. Thus creating a potential pocket (or well) in the region beneath the electrode gap introduces charge transfer inefficiency.

CCD with U-shaped gates employs adjacent, non-overlapping U-shaped electrodes within the CCD. This prior art addresses the non-uniformity and decreased CTE problems of the ITO CCD. Since the gate electrodes are of a substantially U-shaped geometry, it shields the charge transfer channel from the effects of the fixed charge (that creates the "pockets" as explained previously). However, CCD with U-shaped gates, while addressing the problems of CCD with ITO Gate, is afflicted by reduced full well due to much reduction in the gate area. This manifests as lower dynamic range.

Deposition of material sensitive to short wavelength deposits materials such as UV sensitive organic phosphor coatings (e.g., Coronene or Lumagen). UV sensitive organic phosphor coating converts UV photons to the visible (i.e., increasing wavelength) and thus allows them to be sensed by the photosensitive silicon of the CCD. However, this approach suffers from increased pixel-to-pixel crosstalk due to scattered light emitted from the phosphor layer since there is a gap between the short wavelength sensitive coating, such as Lumagen and the silicon surface. This will reduce image sharpness (i.e., lower the spatial frequency response also referred to as modulation transfer function or MTF).

Virtual-phase CCD with single phase timing technology addresses the QE problem of the front illuminated CCD by eliminating at least one of the gate structures and thus leaving part of the pixel area uncovered by polysilicon layers associated with the gate. Thus a larger part of the CCD pixel is exposed, thereby allowing photons to enter the photosensitive silicon of the CCD unimpeded. In order to facilitate one of the charge transfer phases employed by the CCD, a virtual electrode is formed by means of appropriate implants. A drawback to this technology is that it also suffers from charge transfer efficiency (CTE) problems due to spurious potential pockets which trap charges in the signal transfer channel. The potential pockets are the result of unavoidable small misalignment of implants for potential well shape. Adding background charge in order to fill the pockets may increase CTE but inevitably increases noise (i.e., shot noise of the added background charge).

Open-pinned-phase (OPP) CCD with dual-phase timing technology addresses the QE of the front-illuminated CCD by eliminating one gate structure and thus also leaving part of the pixel area uncovered by polysilicon layers associated with the gate. Thus, a larger part of the CCD pixel is exposed (also referred to as "open"), hence allowing photons to enter the photosensitive silicon of the CCD unimpeded. In order to facilitate charge transfer employed by the CCD dual gate structure is utilized. However, OPP CCD with dual-phase timing suffers from slow charge transfer process, thus precluding it from usage in applications where reasonable frame rates are of interest. Since the transfer through the open phase is unaided by electric or fringing fields and controlled primarily through thermal diffusion for smaller charge packets, the CTE at higher speeds will be unacceptable for low signals, and poor for even larger packets that are helped by self induced drift.

Accordingly, it is desirable to have a CCD that can provide very high Quantum Efficiency at a reasonable price for high frame rate and other demanding application without the disadvantages discussed above associated with prior art CCDs or imaging sensors.

SUMMARY

One aspect of the present invention discloses a six-phase Front Illuminated Charge Coupled Device (CCD) pixel with a channel potential gradient and a window through which a wide band of photons can be sensed by the photosensitive silicon of the CCD, thus providing very high quantum Efficiency (QE) similar to the back thinned CCD without the concomitant yield and cost problems. The window is formed via commonly available fabrication process etch steps. Employing selective etch steps allows the removal of the layers residing on the top of the photosensitive silicon, such as the glass protective layer, the oxide gate insulating layer, the conductive gate layer such as polysilicon, and inter-metal dielectrics, without distorting the geometry of the cell. An implant doping for providing channel potential gradient from high to low potential levels is created within the silicon beneath the window region to facilitate high charge transfer efficiency (i.e., high CTE) from pixel to pixel via the transfer gates. In addition, the window provides a self aligned mask for the implantation steps and thus prevents the formation of pockets (or wells) due to misalignments that decrease the charge transfer efficiency and causes non-uniformity problems as associated with prior art. Furthermore the window provides a flat region that can be covered with an anti-reflective (AR) coating layer, thus further increasing the QE.

The implant doping may be, but not limited to, for example, boron in case of a P-channel CCD (PMOS) or, for example, phosphorus in case of an N-channel CCD (NMOS). Four independent transfer gates are formed from conductive material such as, but not limited to, polysilicon or transparent material such as indium-tin-oxide (ITO). The silicon regions that are controlled by these gates via six-phase timing will be further detailed in the accompanying drawings and the description that are set forth below. These regions have channel potential that can block charge transfer from reaching the volume under the window during the off-phase and deep enough channel potential to allow charge that is stored beneath the window region to be transferred during the on-phase.

In accordance with one aspect of the current invention, the channel potential gradient in the silicon volume beneath the window region is achieved via forming a 3-D (three dimensional) geometrical implant such as a trapezoid. The implant width is inversely proportional to the potential energy, and thus implant width with respect to the charge transfer lateral direction is increased and hence produces potential energy that is decreased. This process is also referred to as "two dimensional" potential effect and is related to such effect as narrow channel FET effect. This mechanism will be apparent from the accompanying drawings and the description that are set forth below.

In accordance with another aspect of the current invention, the channel potential gradient in the silicon volume beneath the window region is achieved via multiple lateral implantation steps with gradual change in doping characteristic. Its implant step in the lateral direction of the charge transfer has a different doping characteristic (for example, doping concentration) that provides a gradual or stepped decrease in potential energy. Thus, a channel potential gradient from high to low potential in the direction of the charge transfer is created.

These and other features and advantages of the present invention will be more readily apparent from the detailed description of the preferred embodiments set forth below taken in conjunction with the accompanying drawings.

BRIEF DESCRIPTION OF THE FIGURES

Like element numbers in different figures represent the same or similar elements.

DETAILED DESCRIPTION

Figure 1:
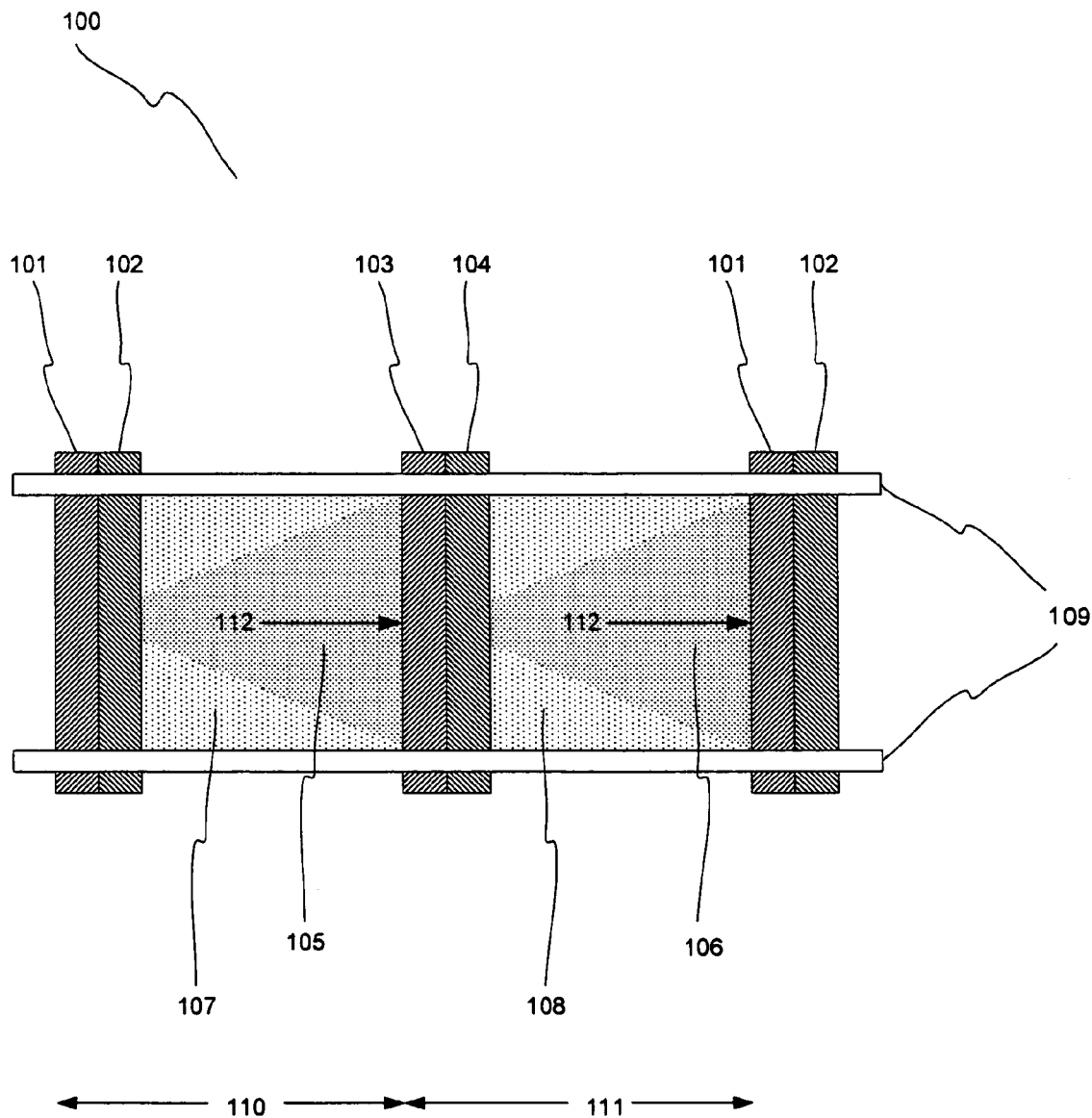
FIG. 1 provides a top view of a pixel-pair of a six-phase front-illuminated CCD in accordance with one embodiment of the current invention.

FIG. 1 provides a top view of a pixel-pair 100 of a six-phase front-illuminated CCD according to one embodiment of the present invention. The pixel-pair 100 comprises two cells 110 and 111 which accommodate charge transfer in a direction 112 from cell 110 to cell 111. A plurality of pixel-pairs 100 may form a CCD array with additional circuitry such as parallel and serial shift registers, charge amplification blocks and so on, as is known in the art. Pixel-pair 100 includes four independently controlled gates 101, 102, 103 and 104 that are formed from conductive material such as but not limited to polysilicon or transparent material such as indium-tin-oxide (ITO). The potential energy within the silicon regions is controlled by these gates via six-phase timing that will be further detailed in FIG. 3. Pixel-pair 100 further includes window regions 107 and 108 through which wide a band of photons can be sensed by the photosensitive silicon beneath it, thus providing very high QE. Within the window regions 107 and 108, channel potential gradient regions 105 and 106 are created via implant doping steps that may be but not limited to for example boron in case of a P-channel CCD (PMOS) or for example phosphorus or arsenic in case of an N-channel CCD (NMOS).

The channel potential gradient regions 105 and 106 provide a permanent gradient from high to low potential levels that facilitate high efficiency charge transfer (i.e., high CTE) from cell 110 to cell 111. The charge transfer is controlled by changing voltage levels in each of the gates 101-104 following a six-phase scheme as depicted in FIG. 3. Cycling through the voltage levels accordingly changes the potential in each region beneath gates 101-104 from a sufficiently high level to block charge from reaching the window region 107 or 108, respectively, during the off-phase to a sufficiently low level to allow charge to transfer from region 107 to 108 during the on-phase.

Potential wells in the regions beneath control gates 101-104 are sufficiently deep due to proper implantation such as can be achieved via first implanting all portions of the pixel-pair 100 with the sample implant (e.g., a blanket implant). For example, with an N-channel CCD, this implant may be but not limited to for example phosphorous with a dose of 2E12/cm$^2$ at energy of 150 keV. Since this implant resides in all portions of cells 110 and 111 and is the only implant for gates 101-104, the regions beneath gates 101-104 are self-aligned.

In accordance with one aspect of the current invention, the channel potential gradient in regions 105 and 106 in the silicon volume beneath the window regions 107 and 108, respectively, is achieved via forming a 3-D (three dimensional) geometrical implant such as a trapezoid. The implant width is inversely proportional to the potential energy. As the implant width increases with respect to the charge transfer lateral direction 112, the potential energy is decreased, thus facilitating fast and efficient charge transfer in the direction 112. This process is also referred to as "two dimensional" potential effect and is related to such effect as narrow channel FET effect.

The implant shape is achieved via commonly available fabrication steps incorporating masks and implantations. For example, with an N-channel device, the implant may be but limited to phosphorus with a dose of approximately 1E12/cm² at energy of approximately 200 keV.

The window regions 107 and 108 are created via commonly available fabrication process steps of selective etch and appropriate masks. Employing selective etching allows the removal of the layers residing on the top of the photosensitive silicon, such as the glass protective layer (not shown here), the oxide gate insulating layer (not shown here), and the conductive layer used for gates 101-104 (e.g., polysilicon or ITO).

The window regions 107 and 108 are formed before the implant doping steps, thus providing a self aligned mask for the implantation steps. Guaranteeing the implant alignment in this matter prevents the formation of pockets (or wells) due to misalignments that decrease the charge transfer efficiency and causes non-uniformity problems as associated with prior art. Furthermore, an anti-reflective (AR) coating layer that is not shown here can be deposited on the flat surface of the window regions 107 and 108 and thus further increasing the QE.

The surface regions underneath the window 107 and 108 may be further pinned to the substrate potential by an implant that produces a degenerately doped region at the surface. For the N-channel example given here, this is typically done with but not limited to boron of a dose such as 1E12/cm² at a low energy that depends on the thickness of the material through which the implant is being done (for example energy of 10 keV).

Figure 2:
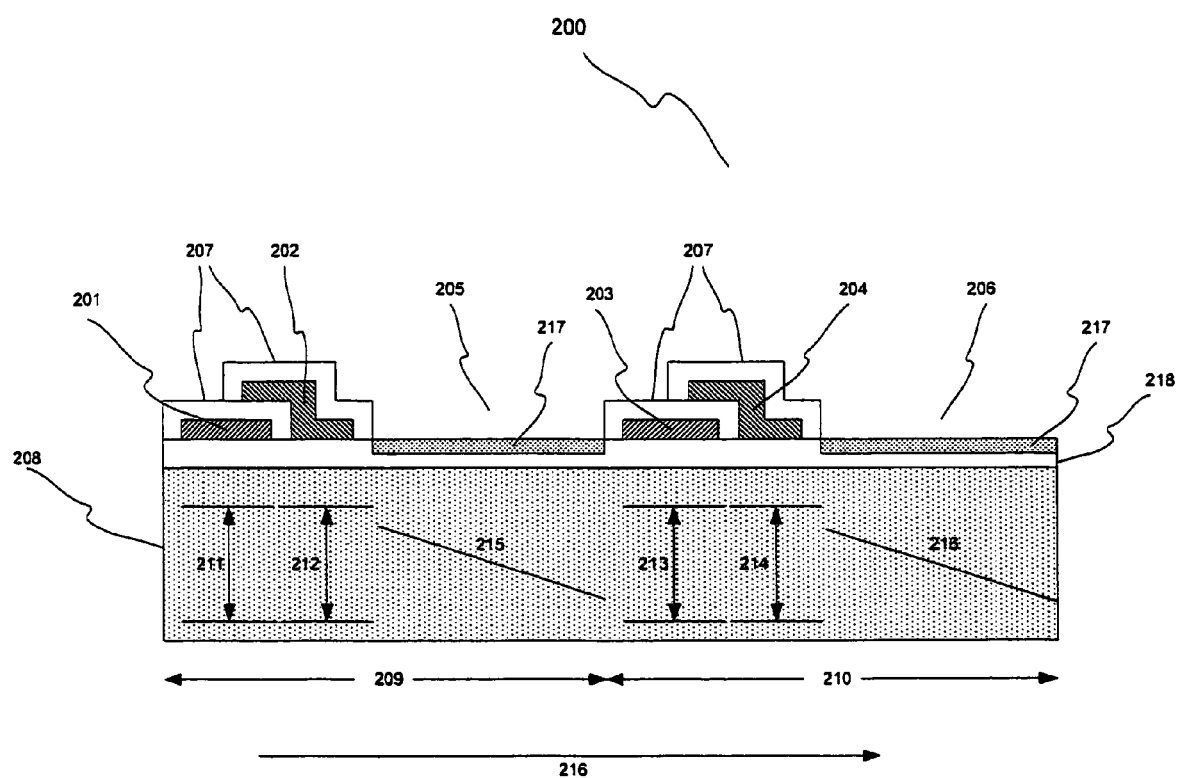
FIG. 2 provides a side view of a pixel-pair with gradient potential window regions that is part of the six-phase front-illuminated CCD of FIG. 1.

FIG. 2 provides a side view of a pixel-pair 200 with gradient potential window regions that is part of the six-phase front-illuminated CCD. The pixel-pair 200 comprises two cells 209 and 210 which accommodate charge transfer in a direction 216 from cell 209 to cell 210. A plurality of pixel-pairs 200 may form a CCD array with additional circuitry such as parallel and serial shift registers, charge amplification blocks, and so on. Prior to gate deposition, a high quality gate dielectric 218 is grown or deposited on a silicon substrate 208. The dielectric 218 can be but not limited to SiO₂ (silicon oxide) or a compound dielectric such as silicon-oxi-nitride. Pixel-pair 200 includes four independently controlled gates 201, 202, 203 and 204 that are formed via deposition of conductive material on the silicon substrate 208, such as but not limited to polysilicon or transparent material such as indium-tin-oxide (ITO). The gates 201-204 may be doped via implantation or diffusion to increase conductivity. The gates 201-204 are further thermally oxidized to provide a high quality isolation insulator layer 207 (i.e., the oxide layer prevents any connection between gates 201-204). The isolation layer 207 is not limited to thermally oxidation and can be formed via other methods known to those who skilled in the art such as deposition. Additional steps known to those skilled in the art such as deposition of compound insulators for example oxy-nitride or other protective (not shown here) may be employed.

The potential energy levels 211, 212, 213 and 214 within the silicon substrate 208 are controlled by gates 201, 202, 203 and 204, respectively, via six-phase timing that will be further detailed in FIG. 3. Pixel-pair 200 further includes window regions 205 and 206 through which a wide band of photons can be sensed by the photosensitive silicon beneath it, thus providing very high QE.

Within the window regions 205 and 206, channel potential gradient regions 215 and 216 are created via implant doping that may be but not limited to for example boron in case of a P-channel CCD (PMOS) or for example phosphorus in case of an N-channel CCD (NMOS) as demonstrated in the embodiments of the current invention that are depicted in FIG. 1 and FIG. 2. An N-channel process is selected for demonstration of the current invention and can be easily converted to P-channel process by those who are skilled in the art. Additional implants (not shown here) for surface pinning underneath the window regions 205 and 206 may be employed (e.g., boron).

The channel potential gradient regions 215 and 216 each provide a permanent gradient from high to low potential levels in the direction 216 that facilitate high efficiency charge transfer (i.e., high CTE) from cell 209 to cell 210. The charge transfer is controlled by changing voltage levels in each of the gates 201-204 independently, following the six-phase scheme that is depicted in FIG. 3. Cycling through the voltage levels accordingly changes the potential levels 211-214 in each region beneath gates 201-204, respectively, from a high enough level to block charge from reaching the window region 205 or 206, respectively, during the off-phase to a sufficiently low level to allow charge to transfer from region 205 to 206 during the on-phase.

The window regions 205 and 206 are formed before the implant doping steps, thus providing a self aligned mask for the implantation steps. This ensures the implants are aligned and thus prevents the formation of pockets (or wells) due to misalignments which are a serious problem that afflicts conventional devices and causes poor charge transfer efficiency and non-uniformity.

The permanent channel potential gradients 215 and 216 allow for a fast and complete charge transfer and thus provide high CTE at high frame rate. Furthermore, the anti-reflective (AR) coating layer 217 is deposited on the flat surface of the window regions 205 and 206, thus further increasing the QE.

Figure 3A:
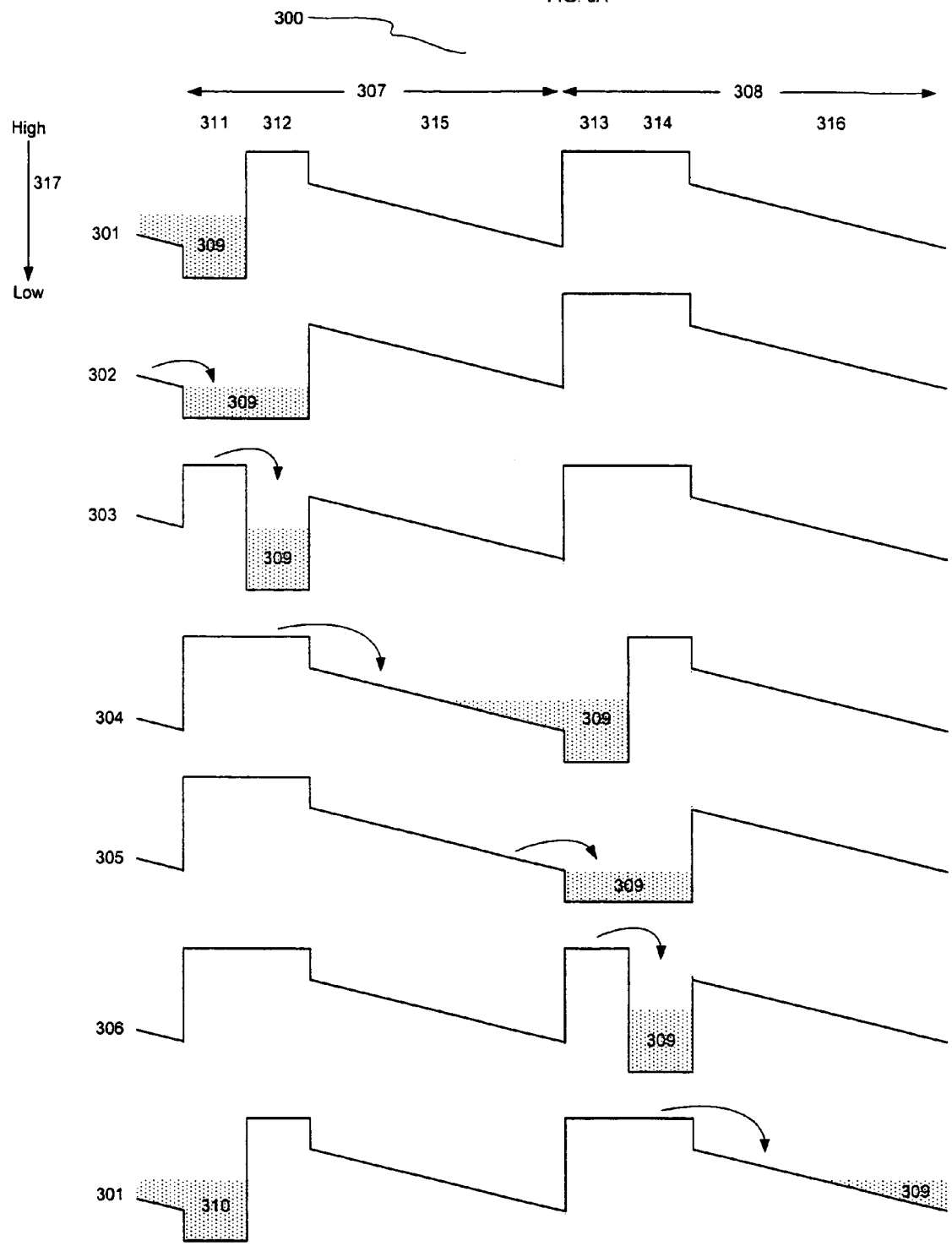
FIG. 3A illustrates the potential well and barrier aspects of the six-phase potential timing of a pixel-pair that is part of the six-phase front-illuminated CCD of FIG. 1.
Figure 3B:
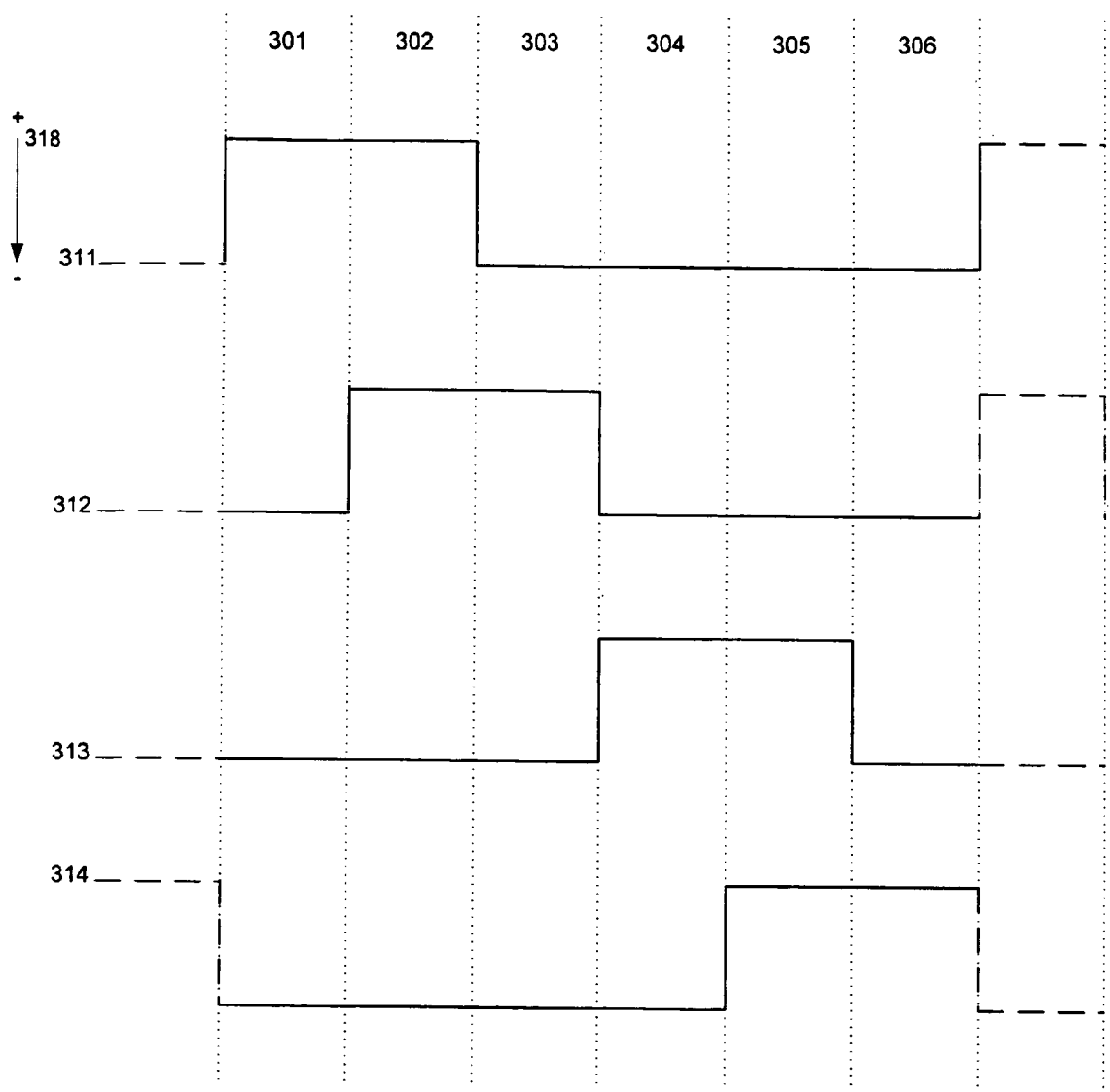
FIG. 3B illustrates the voltage aspects of the six-phase timing of a pixel-pair that is part of the six-phase front-illuminated CCD of FIG. 1.

FIGS. 3A and 3B illustrate a six-phase timing in accordance with a front-illuminated CCD as disclosed herein in one embodiment. FIG. 3A demonstrates the charge transfer stages from cell 307 to cell 308 within a pixel-pair 300 according to one embodiment. Cells 307 and 308 are similar to cells 110 and 111 of FIG. 1 and cells 209 and 210 of FIG. 2. The pixel-pair 300 may be part of a front-illuminated CCD and is detailed in FIGS. 1, 2, and 4. FIG. 3A shows the potential changes cycle (potential level indicated by 317), while FIG. 3B shows the control gates voltage levels (voltage level indicated by 318).

As explained previously, charge is accumulated underneath window regions 315 and 316 proportionally to the wide band of photons that are sensed by the photosensitive silicon during the integration time period. The charge transfer is facilitated via independent potential changes in the regions beneath control gates 311, 312, 313 and 314 and the permanent channel potential gradient in window regions 315 and 316. The potential changes in regions beneath control gates 311, 312, 313 and 314 are induced by voltage applied independently to the gates in each of the six phases 301-306.

The process chosen for demonstration is for an N-channel device (NMOS) but those who skilled in the art can apply the scheme to a P-channel (PMOS) device with opposite voltages.

During phase 301, positive voltage is applied to the control gate 311, thus creating a well in the region beneath gate 311 into which charge that was accumulated in a previous cell of a previous pixel-pair (not shown here) is transferred. At the same time, negative voltage is applied to the control gate 312, thus providing a barrier in the region beneath the gate 312 that prevents charge 309 from leaking into window region 315. The region beneath control gates 313 and 314 of cell 308 are both in high potential (barrier) state (a negative voltage applied to both control gates 313 and 314).

During phase 302, positive voltage is applied to the gate 312 thus providing together with gate 311 a well beneath both gates 311 and 312 that is sufficient to accumulate all the 309 (i.e., emptying the prior cell not shown here). The region beneath control gates 313 and 314 of cell 308 both remain in a high potential (barrier) state.

During phase 303, negative voltage is applied to gate 311 thus providing a barrier in the region beneath gate 311, thereby preventing charge 309 from leaking back into the prior cell (not shown here). Potential well in the region beneath control gate 312 is sufficiently deep (due to proper implantation as explained in FIG. 1) to completely hold charge 309 and prevent charge leakage. The region beneath control gates 313 and 314 of cell 308 both still remain in a high potential (barrier) state.

During the next phase 304, negative voltage is applied to gate 312, thus increasing the potential in the region beneath gate 312 and spilling the charge 309 into the region beneath window 315. Since the potential in region 315 is permanently sloping from high near region beneath control gate 312 to low near next cell 308, charge 309 that has been spilled from the region beneath control gate 312 quickly migrates within region 315 toward next cell 308. The charge 309 is further accumulating in region beneath control gate 313 of next cell 308 since gate 313 is provided with positive voltage thus providing a potential well. The region beneath control gate 314 still provides a barrier (to allow cell 308 to empty prior to charge transfer).

During the next phase 305, positive voltage is applied to gate 314, thus providing together with the region beneath control gate 313 a well sufficient to completely hold charge 309, thus emptying region 315 of cell 307.

During the last phase 306 in the six-phase cycle, positive voltage is maintained on gate 314 while a negative voltage is applied to gate 313, collecting all the charge under gate 314 and getting ready to shift it to the next cell on the next phase. The barrier created under gate 313 prevents charge from leaking back into region 315.

The diagram further shows for completeness purpose the first phase 301 of the next six-phase cycle where charge 309 will now spill into region 316 in cell 308 and new charge 310 enters cell 307.

Figure 4:
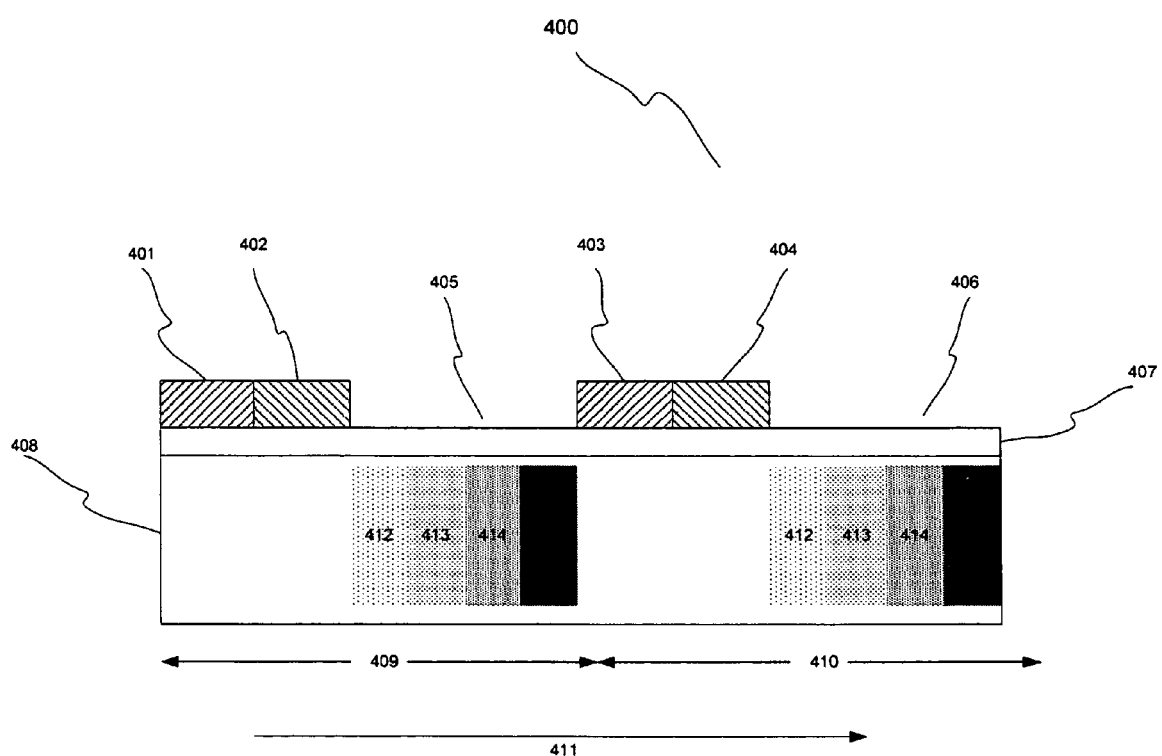
FIG. 4 depicts a side view of a pixel-pair of a six-phase front-illuminated CCD in accordance with another embodiment of the current invention.

FIG. 4 depicts a side view of a pixel-pair 400 of a six-phase front-illuminated CCD with a window region and channel potential gradient in accordance with another embodiment of the current invention. The pixel-pair 400 comprises two cells 409 and 410 which accommodate charge transfer in the direction 411 from cell 409 to cell 410. A plurality of pixel-pairs 400 may form a CCD array with additional circuitry such as parallel and serial shift registers, charge amplification blocks and so on. Pixel-pair 400 includes four independently controlled gates 401, 402, 403 and 404 that are formed from conductive material such as but not limited to polysilicon or transparent material such as indium-tin-oxide (ITO). The potential energy within the silicon regions is controlled by these gates via six-phase timing that was detailed in FIG. 3A and FIG. 3B. Pixel-pair 400 further includes window regions 405 and 406 through which a wide band of photons can be sensed by the photosensitive silicon beneath it, thus providing very high QE. Within the window regions 405 and 406, channel potential gradient regions are created via implant doping that may be but not limited to for example boron in case of a P-channel CCD (PMOS) or for example phosphorus in case of an N-channel CCD (NMOS).

The channel potential gradient regions 405 and 406 provide a permanent gradient from high to low potential levels that facilitate high efficiency charge transfer (i.e., high CTE) from cell 409 to cell 410. The charge transfer is controlled by changing voltage levels in each of the gates 401-404 following the six-phase scheme as depicted in FIG. 3A and FIG. 3B. Cycling through the voltage levels accordingly changes the potential in each region beneath gates 401-404 from a high enough level to block charge from reaching the window region 405 or 406, respectively, during the off-phase to a sufficiently low level to allow charge to transfer from region 405 to 406 during the on-phase.

In accordance with another aspect of the current invention, the channel potential gradient in regions 405 and 406 beneath the window regions comprises increasing levels of doping concentration regions 412-415. A low doped region 412 is near cell 409, with higher doped regions closer to cell 410, ending with a highly doped region 415 towards cell 410. In the example represented in FIG. 4, the photosensitive regions 405 and 406 comprise a plurality of sub-regions 412, 413, 414, and 415 that are parallel to each other with respect to the charge transfer direction 411, each having an increased doping concentration of for example phosphorus or arsenic in case of N-channel device. This results in a stepwise change in doping concentration providing the fringing field necessary to promote charge movement, thus facilitating fast and efficient charge transfer in the direction 411.

The regions 412-415 can be achieved via available fabrication steps utilizing for example a "sliding mask" that, over several implants of the same dose of for example phosphorus or arsenic for an N-channel device, would expose progressively more of the area beneath window regions 405 and 406. The result would be a multi-stepped region comprising regions 412, 413, 414 and 415 that have increasing concentration in the direction of charge transfer 411.

The window regions 405 and 406 are created via commonly available fabrication process steps of selective etch. Employing selective etch allows the removal of the layers residing on the top of the photosensitive silicon such as the glass protective layer (not shown here), the oxide gate insulating layer (not shown here), and the conductive layer used for gates 401-404 (e.g. Polysilicon or ITO). The window process was further detailed in FIG. 1

The window regions 405 and 406 are formed before the doping steps thus providing a self aligned mask for the said doping steps. The alignment prevents the formation of pockets (or wells) due to misalignments that decrease the charge transfer efficiency and causes non-uniformity problems as associated with conventional devices.

The surface regions underneath the window 405 and 406 may be further pinned to the substrate potential by an implant that produces a degenerately doped region at the surface. For the N-channel example given here, this is typically done with but not limited to boron of a dose such as $1E12/cm^2$ at a low energy that depends on the thickness of the material through which the implant is being done (for example energy of 10 keV).

Having thus described embodiments of the present invention, persons of ordinary skill in the art will recognize that changes may be made in form and detail without departing from the scope of the invention. Thus the invention is limited only by the following claims.

What is claimed is:

1. A method of operating a charge coupled device (CCD), comprising:
    applying a first voltage to a first control gate to create a first well underneath the first control gate and accumulate charge into the first well;
    applying a second voltage to a second control gate to create a first barrier underneath the second control gate;

applying a third voltage to the second control gate to create a second well underneath the second control gate, wherein the first and second wells form a first combined well, and accumulate the charge into the first combined well underneath the first and second control gates;

applying a fourth voltage to the first control gate to create a second barrier underneath the first control gate and transfer the charge from the first well underneath the first control gate into the second well underneath the second control gate; and applying a fifth voltage to the second control gate to create a third barrier underneath the second control gate to transfer the charge across a decreasing potential region underneath a first window region, wherein the decreasing potential region comprises a plurality of increasing doping concentrations.

2. The method of claim 1, further comprising applying a sixth voltage to a third control gate to create a third well underneath the third control gate and accumulate the charge from the decreasing potential region, wherein first, second, and third control gates are independently controlled.

3. The method of claim 2, further comprising applying a seventh voltage to a fourth control gate to create a fourth well underneath the fourth control gate, wherein the third and fourth wells form a second combined well, and accumulate the charge into the second combined well underneath the third and fourth control gates, wherein first, second, third, and fourth control gates are independently controlled.

4. The method of claim 3, further comprising applying an eighth voltage to the third control gate to create a fourth barrier underneath the third control gate and transfer the charge from the third well underneath the third control gate into the fourth well underneath the fourth control gate.

5. The method of claim 4, further comprising a ninth voltage to the fourth control gate to create a fifth barrier underneath the fourth control gate to transfer the charge across a decreasing potential region underneath a second window region.

6. The method of claim 1, wherein the first and third voltages are approximately equal and the second, fourth, and fifth voltages are approximately equal.

7. The method of claim 1, wherein the CCD is an N-channel device.

8. The method of claim 7, wherein the first and third voltages are positive voltages and the second, fourth, and fifth voltages are negative voltages.

9. The method of claim 1, wherein the CCD is a P-channel device.

10. The method of claim 9, wherein the first and third voltages are negative voltages and the second, fourth, and fifth voltages arc positive voltages.

11. The method of claim 1, wherein the decreasing potential region comprises non-stepwise gradual decreasing potential regions.

12. The method of claim 1, wherein the decreasing potential region comprises a plurality of stepwise decreasing potential regions.

13. The method of claim 1, wherein the first voltage is maintained at the first control gate when applying the second voltage to the second control gate.

14. A method of operating a charge coupled device (CCD), comprising:

applying a first voltage to a first control gate to create a first well underneath the first control gate and accumulate charge into the first well;

applying a second voltage to a second control gate to create a first barrier underneath the second control gate;

applying a third voltage to the second control gate to create a second well underneath the second control gate, wherein the first and second wells form a first combined well, and accumulate the charge into the first combined well underneath the first and second control gates;

applying a fourth voltage to the first control gate to create a second barrier underneath the first control gate and transfer the charge from the first well underneath the first control gate into the second well underneath the second control gate;

applying a fifth voltage to the second control gate to create a third barrier underneath the second control gate to transfer the charge across a decreasing potential region underneath a first window region;

applying a sixth voltage to a third control gate to create a third well underneath the third control gate and accumulate the charge from the decreasing potential region, and applying a seventh voltage to a fourth control gate to create a fourth well underneath the fourth control gate, wherein the third and fourth wells form a second combined well, and accumulate the charge into the second combined well underneath the third and fourth control gates, wherein the first, second, third, and fourth control gates are independently controlled.

15. The method of claim 14, further comprising applying an eighth voltage to the third control gate to create a fourth barrier underneath the third control gate and transfer the charge from the third well underneath the third control gate into the fourth well underneath the fourth control gate.

16. The method of claim 15, further comprising a ninth voltage to the fourth control gate to create a fifth barrier underneath the fourth control gate to transfer the charge across a decreasing potential region underneath a second window region.

17. The method of claim 14, wherein the first voltage is maintained at the first control gate when applying the second voltage to the second control gate.

\* \* \* \* \*